United States Patent [19]
Merrill

[11] Patent Number: 5,592,006
[45] Date of Patent: Jan. 7, 1997

[54] GATE RESISTOR FOR IGBT

[75] Inventor: Perry Merrill, El Segundo, Calif.

[73] Assignee: International Rectifier Corporation, El Segundo, Calif.

[21] Appl. No.: 530,014

[22] Filed: Sep. 19, 1995

Related U.S. Application Data

[63] Continuation of Ser. No. 242,436, May 13, 1994, abandoned.

[51] Int. Cl.$^6$ .......................... H01L 29/76; H01L 29/74; H01L 29/94; H01L 29/00
[52] U.S. Cl. .......................... 257/337; 257/140; 257/146; 257/154; 257/334; 257/536; 257/538
[58] Field of Search .................................. 257/139, 140, 257/146, 154, 334, 337, 339, 341, 536, 538

[56] References Cited

U.S. PATENT DOCUMENTS 4,495,513  1/1985  Descamps ........................ 257/337

FOREIGN PATENT DOCUMENTS 60-171771  9/1985  Japan ........................ 257/337
1-61046    3/1989  Japan ........................ 257/538

Primary Examiner—Steven H. Loke
Attorney, Agent, or Firm—Ostrolenk, Faber, Gerb & Soffen, LLP

[57] ABSTRACT

A polysilicon gate resistor consists of a plurality of parallel polysilicon strips extending from gate finger to gate pad. Different numbers of parallel strips can be selected during manufacture by using different contact masks.

51 Claims, 3 Drawing Sheets

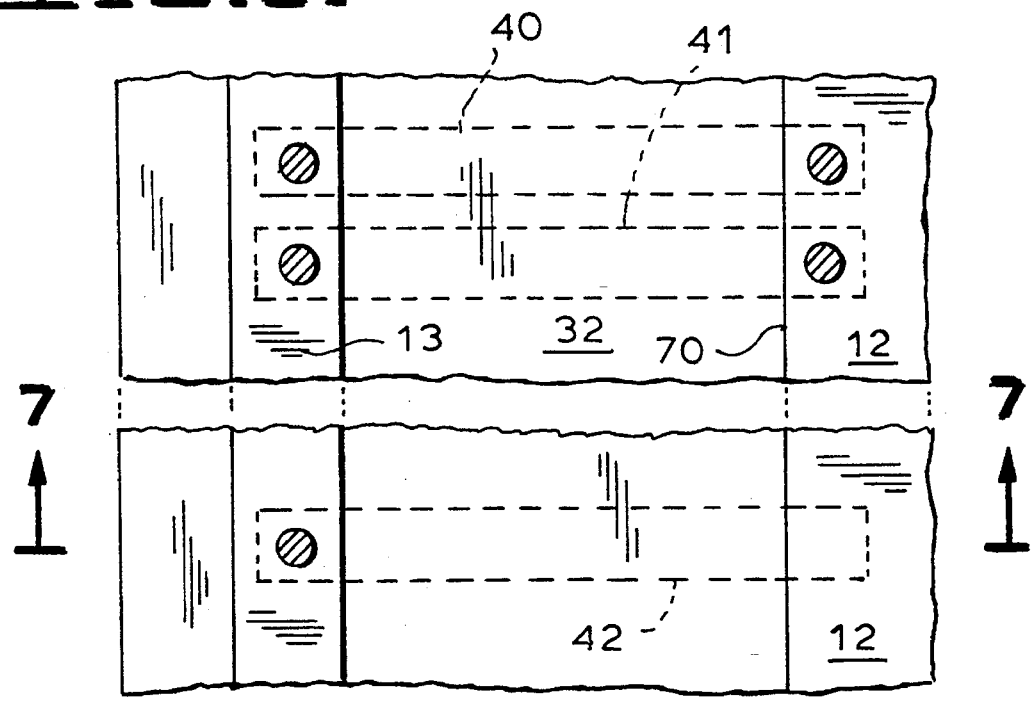
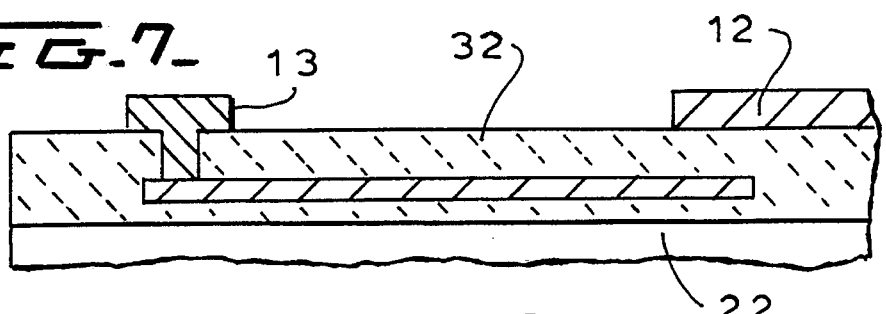
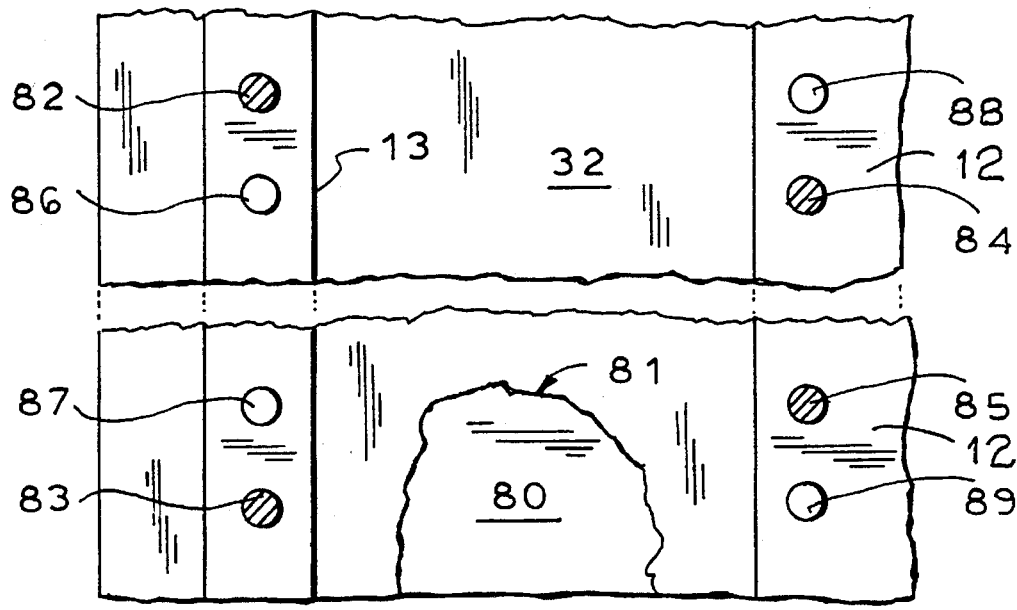

GATE RESISTOR FOR IGBT

This is a continuation of application Ser. No. 08/242,436 filed on May 13, 1994, now abandoned.

BACKGROUND OF THE INVENTION

This invention relates to insulated gate bipolar transistors (IGBTs), and more specifically relates to a novel integral gate resistor for such devices to improve their operation when connected in parallel.

IGBTs are well known MOS gate controlled bipolar transistors. Such devices are described in application Ser. No. 08/041,136, filed Mar. 30, 1993, now refiled as continuation application Ser. No. 08/316,112, filed Sep. 30, 1994, entitled POWER TRANSISTOR DEVICE HAVING ULTRA DEEP INCREASED CONCENTRATION REGION, and is assigned to the assignee of the present invention. The use of two or more IGBT devices in parallel circuit connection is also known, and is described in copending application Ser. No. 08/122,052, filed Sep. 15, 1993, in the name of Courtney Furnival, which is also assigned to the assignee of the present invention.

When IGBTs are connected in parallel, for example, when connecting plural IGBTs on a common heat sink to increase the current capacity of an assemblage of IGBTs, it is known that the load current may tend to oscillate between the parallel IGBTs. This effect is reduced by connecting small resistors in the gate circuits of the IGBTs. The desired gate resistance value will vary from about 5 ohms to 50 ohms, depending on the number of die which are connected in parallel. The added gate resistors require an added component which takes up added space in an assembly, for example, the IGBT module of application Ser. No. 08/122,052, referred to above, and requires additional assembly steps.

BRIEF DESCRIPTION OF THE INVENTION

In accordance with the invention, a gate resistor is integrated into an IGBT chip. The novel resistor consists of an adjustable length or width of a resistive area connected between the gate finger and gate pad of the device. In a preferred embodiment, a plurality of parallel polysilicon resistor strips extending from the polysilicon gate lattice of the device to a metal gate connection pad. Resistance is increased simply by preventing one or more of the strips from making the connection between the gate fingers and gate pad.

The resistor value is easily adjusted during manufacture, simply by a small variation in the mask for the etching of the metals applied to the device, to define the gate, the source contacts and source pad, and the gate pad. Thus, the shape of the metal gate pad can vary in otherwise identical masks such that the gate pad contacts a different selected number of polysilicon resistor strips. Thus, only a few slightly different metal masks will define a corresponding set of resistance values for the gate resistor of the IGBT die in the wafer being manufactured. Alternatively, the contact mask can be changed so that only selected fingers are contacted, either at the gate finger or gate pad.

A continuous resistive sheet can also be used, with variable numbers and spacings of the contacts to the gate finger or gate pad. The contact areas can also be varied.

While the resistive sheet or resistive fingers are described as polysilicon, other materials could be used, for example, nichrome, polysilicides, cermets and the like.

Other features and advantages of the present invention will become apparent from the following description of the invention which refers to the accompanying drawings.

BRIEF DESCRIPTION OF THE DRAWINGS

FIG. 6 is similar to FIG. 3, for a second embodiment of the invention.

FIG. 7 is a cross-sectional view of FIG. 6 taken across section line 7—7 in FIG. 6.

FIG. 8 shows a third embodiment of the invention.

DETAILED DESCRIPTION OF THE INVENTION

Figure 1:
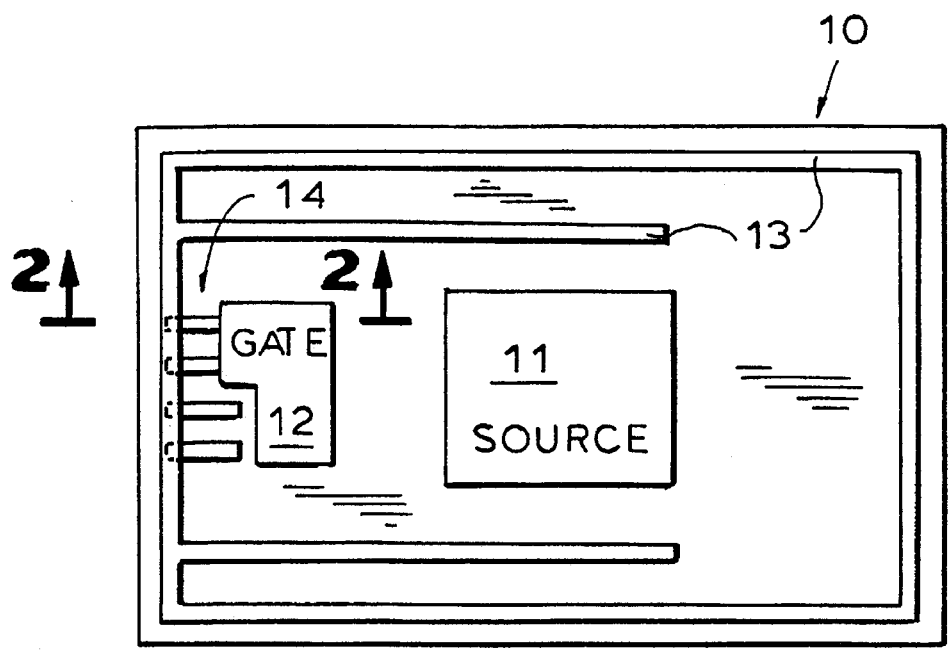
FIG. 1 is a top view of the relevant metal pattern of an IGBT die, using the novel integrated gate resistor of the invention.

Referring first to FIG. 1, there is shown the top view of an IGBT die 10 showing, in particular, the metal (aluminum) source connection pad 11, metal gate pad 12 and metal gate fingers 13. The metal gate finger pattern may be similar to that of U.S. Pat. No. 5,130,767, owned by the assignee of the present invention, and may be connected to an underlying polysilicon gate lattice at spaced locations on the lattice, as shown in U.S. Pat. No. 5,130,767, or may be otherwise connected to the lattice over the full extent of the gate finger. A plurality of polysilicon connection fingers 14, for connecting the gate fingers 13 to the gate pad, are also shown schematically, although these are, in fact, covered by oxide.

Figure 2:
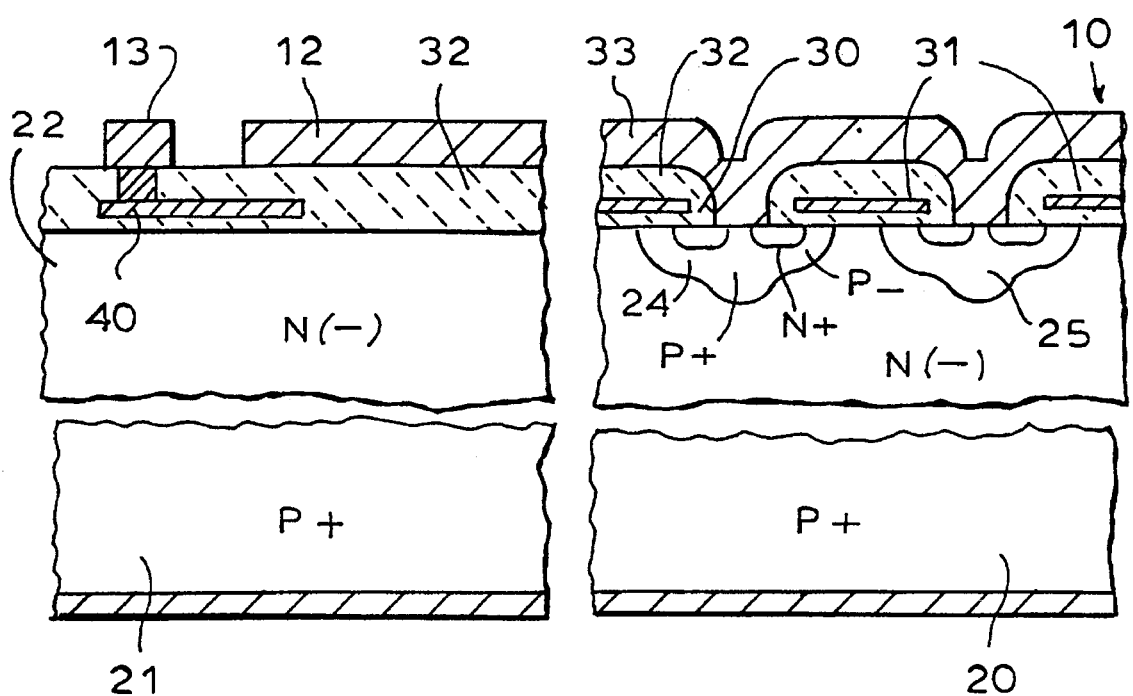
FIG. 2 is a cross-section of die of FIG. 1 taken across the section line 2—2 in FIG. 1.

The basic junction patterns of the IGBT die 10 is shown in FIG. 2, where the die has a bottom main contact 20 connected to a bottom P+ region 21 of a single silicon die. An N+ region (not shown) may be disposed atop P+ region 21, and an N(−) epitaxially deposited region 22 is conventionally formed at the top of the die to receive the junction patterns to form the IGBT device. In the structure of FIG. 2, a cellular junction pattern of the type described in U.S. Pat. No. 5,008,725, or in above-noted pending application Ser. No. 08/041,136 is used. Only a few cells 24 and 25, each having P+ body, a P(−) channel region and an N+ source are shown in FIG. 2. These and a plurality of other identical cells are symmetrically spaced from one another over the surface of the die, defining a symmetrical lattice of N(−) material which reaches the die surface between the cells. This lattice and the P(−) channel regions of the cells is conventionally covered by a thin gate oxide 30 and a conductive polysilicon gate lattice 31. A thick oxide layer 32 then overlies the gate lattice 31, and a top electrode metal 33 overlies the oxide 32 and contacts the P+ regions 24 of the cells 24 and 25 and their sources. The upper surface of layer 33 may be covered by further protective layers, not shown, which are opened in the area of bond pads 11 and 12 in FIG. 1.

While the structure described above is a cellular pattern of the type shown in U.S. Pat. No. 5,008,725, the invention is applicable to an IGBT of any desired topology. Moreover, the structure of FIG. 2 may have the N type concentration of the region between cells increased to an N+ concentration but this is immaterial to the present invention. Further, the invention is also applicable to other MOS gated devices which can benefit from added gate resistance, such as power MOSFETs and MOS gated thyristors.

When applying the source metal 33 to the wafer in which the die 10 is contained, the entire top surface of the die is metallized. In a subsequent "metal mask" step, the top metal is etched away from selected areas of the die to define the gate metal pad 12 and the gate metal fingers 13.

In a conventional IGBT die, the gate fingers extend from and are integral with the gate pad 12. In accordance with the invention, however, the gate pad metal 12 is isolated from the metal gate fingers 13 (which are connected to the underlying polysilicon gate lattice 31) and is connected to the fingers 13 through one or more parallel resistive polysilicon strips 14, thus defining a polysilicon gate resistor of preselected value, depending on the number of parallel strips 14 are used for the connection.

Figure 3:
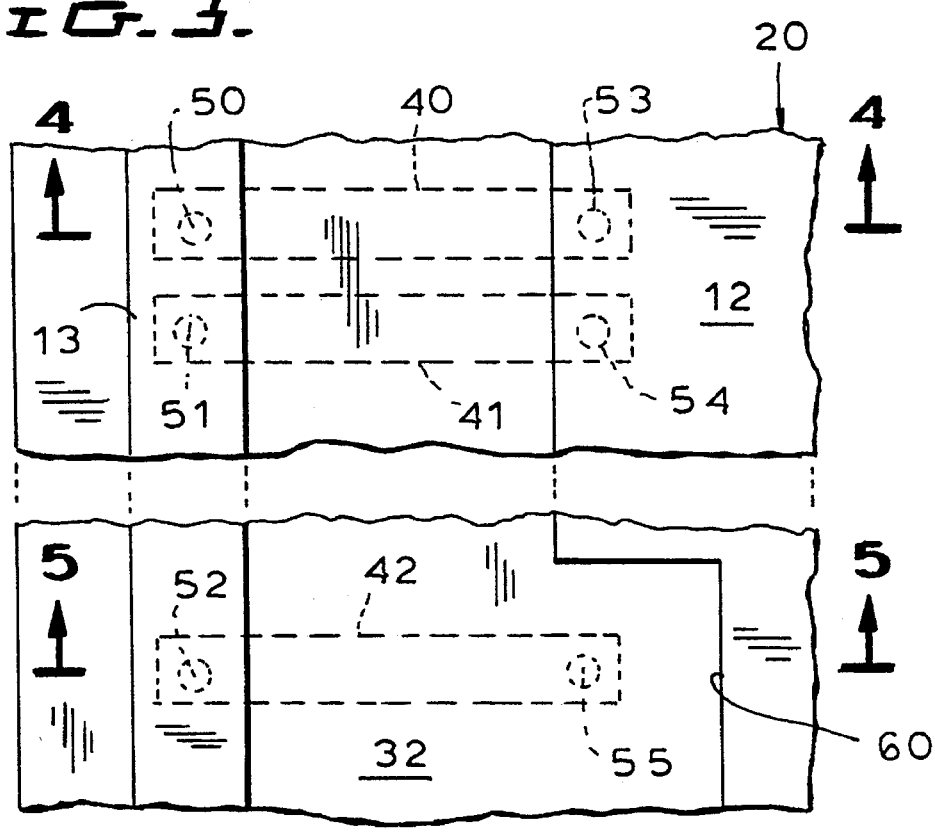
FIG. 3 is an enlarged view of FIG. 1 in the gate resistance region.
Figure 4:
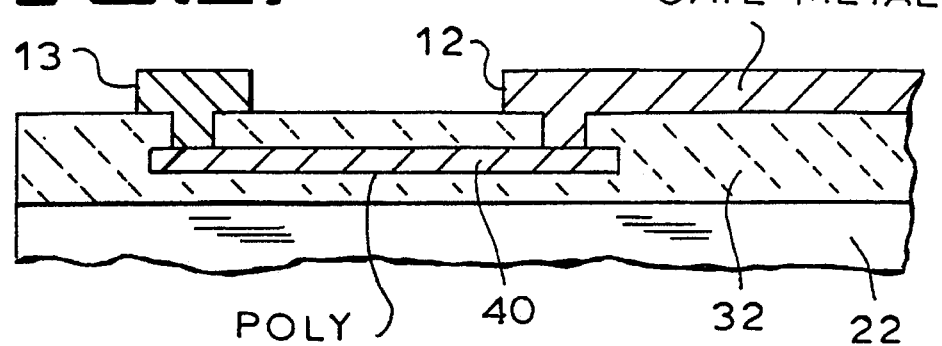
FIG. 4 is a cross-sectional diagram of FIG. 3 taken across section line 4—4 in FIG. 3.

The structure of the polysilicon gate strips 14 is shown in more detail in FIGS. 2 through 5. During the manufacturing process, a layer of polysilicon is deposited and is subsequently etched to form the gate lattice. As shown in FIGS. 2 and 3, a plurality of strips 40, 41 and 42 of resistive polysilicon are formed, and these may also be etched from the same layer of polysilicon which forms polysilicon lattice 31. A plurality of openings, such as openings 50 to 55, are also formed in the oxide layer 32 when the oxide layer 32 is otherwise being patterned, providing metallizing openings in the oxide alignment with the ends of the polysilicon strips 40, 41 and 42. Thus, the metal gate fingers 13 will contact the left-hand end of each of strips 40, 41 and 42 through openings 50, 51 and 52, while the metal of gate pad 12 will contact the other ends of each of the strips which underlie the gate pad 12.

Figure 5:
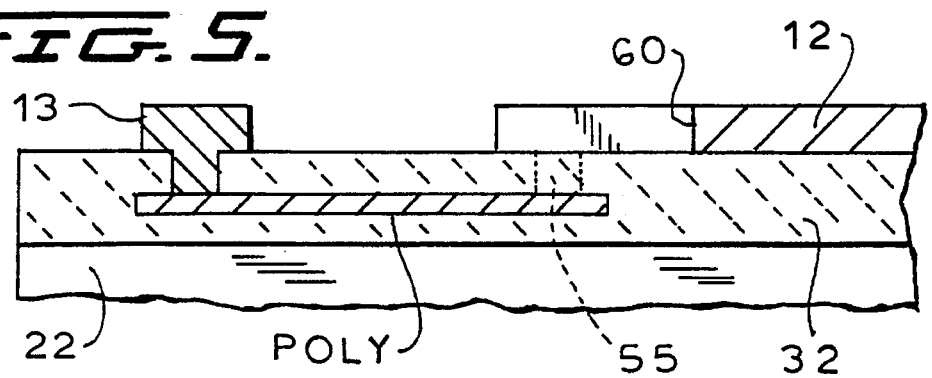
FIG. 5 is a cross-sectional diagram of FIG. 3 taken across section line 5—5 in FIG. 3.

A simple change in the pattern at the left-hand end of gate pad 12 makes it possible to connect the gate pad to any desired number of strips. Thus, in FIG. 2, the gate pad metal overlies the right-hand ends of strips 40 and 41 and thus contacts them (FIG. 4) while the cutout 60 in pad 12 clears opening 55 so that the strip 42 is not contacted (FIG. 5). Accordingly, during the manufacturing process, the choice of a suitable mask pattern modification at the metal mask step allows the selection of any number of polysilicon strips 14 to be connected in parallel, thus setting the gate resistance value as desired for any particular wafer lot being fabricated.

In the preferred embodiment of the invention, nine such strips are formed, each having a thickness of 5000 Å, a length between openings 50 and 53 for strip 40 of about 40 microns, a width of 70 microns and an edge-to-edge spacing, i.e., spacing between the edges of adjacent strips, of 15 microns. Each finger has a resistance along its length of about 80 ohms.

In practice, two separate masks may be used in a manufacturing operation, one connecting four of the strips in parallel, to provide a total gate resistance of about 20 ohms and the other connecting eight strips in parallel to provide a gate resistance of about 10 ohms. Obviously, any other combination could be used. Generally, the integral gate resistor has a resistance in the range of 5 to 50 ohms.

FIGS. 6 and 7 show another embodiment of the invention, in which components similar to those of the prior figures have the same numerals. In FIGS. 6 and 7, the gate pad 12 has a straight edge 70, in contrast to the notched edge 60 of FIG. 3. A similar arrangement of polysilicon fingers spans the distance between gate finger 13 and pad 12 as in FIGS. 3 and 4. However, in FIGS. 6 and 7, the contact mask, used to etch openings in insulation layer 32, is modified to provide openings over only selected ones of fingers 40, 41 and 42. Thus, no opening is formed in the oxide atop the right-hand end of strip 42 so that no contact is made to that strip. However, contacts are made to strips 40 and 41 as shown by cross-hatching in FIG. 6, thus selecting one of several available resistance values.

It should be noted that selective connection could also be made to the gate finger 13 in FIG. 6, instead of to pad 12.

FIG. 8 shows a still further embodiment of the invention in which a single flat sheet of polysilicon 80 is embedded in the insulation, as shown in the region 81, where a portion of the insulation 32 is removed to show sheet 80. Contacts 82, 83, 84 and 85 to the underlying polysilicon 80 and from gate finger 13 and gate pad 12 are schematically shown by cross-hatching. Additional contact locations, available with other contact masks, are shown by circles 86, 87, 88 and 89. These, however, do not permit contact to the underlying polysilicon sheet 80 in FIG. 8. Note that any desired numbers of contacts can be used in FIG. 8 to change the total resistance between the pad 12 and finger 13. Furthermore, different diameter or area openings could also be used.

While polysilicon has been described as the preferred material for the resistive strips or area, other materials can be used, for example, polysilicide, nichrome, cermet, and the like.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOS gate controlled device having an integral gate resistor with a predetermined resistance; said device comprising a silicon die having a predetermined power device junction pattern therein; said junction pattern including a channel region and a polysilicon gate electrode for controlling said channel region to control the turn on and/or off of said device; an insulating layer formed on one surface of said die; a metal layer formed atop said insulating layer and having an elongated metallic gate finger structure which is connected to said polysilicon gate electrode and having a metallic gate pad adapted to be contacted by an external gate lead; a plurality of thin sheets of resistive material defining a plurality of spaced resistors, at least a selected two of said spaced resistors each having one end connected to a portion of said gate finger through a respective first opening in said insulating layer and an opposite end connected to said gate pad through a respective second opening in said insulating layer, whereby the electrical connection from said gate pad to said polysilicon gate electrode includes the resistance of said at least selected two of said spaced resistors and whereby the predetermined resistance of said integral gate resistor is determined by the number of openings in said insulating layer connecting said spaced resistors in parallel with one another and to said gate finger and said gate pad.

2. The device of claim 1 wherein the resistance of said thin sheets of resistive material is adjusted by adjusting the cross-sectional area of each of said at least two spaced resistors.

3. The device of claim 2 wherein a predetermined number of said thin sheets of resistive material are connected to said gate pad and to said gate finger at a plurality of spaced locations.

4. The device of claim 3 wherein said predetermined number of said thin sheets of resistive material are of polysilicon.

5. The device of claim 1 wherein said integral gate resistor has a resistance in the range of 5 to 50 ohms.

6. The device of claim 1 wherein said thin sheets of resistive material are of polysilicon.

7. The device of claim 1 wherein said junction pattern defines an IGBT.

8. The device of claim 1 wherein said junction pattern defines at least one power MOSFET element.

9. The device of claim 1 wherein a predetermined number of said thin sheets of resistive material are connected to said gate pad and to said gate finger at a plurality of spaced locations.

10. A MOS gate controlled device having an integral gate resistor with a predetermined resistance; said device comprising a silicon die having a predetermined power device junction pattern therein; said junction pattern including a channel region and a polysilicon gate electrode for controlling said channel region to control the turn on and/or off of said device; an insulating layer formed on one surface of said die; a metal layer formed atop said insulating layer and having an elongated metallic gate finger structure which is connected to said polysilicon gate electrode and a metallic gate pad adapted to be contacted by an external gate lead; and a plurality of spaced elongated polysilicon resistors, at least a selected two of said polysilicon resistors each having one end connected to a portion of said gate finger through a respective first opening in said insulating layer and an opposite end connected to said gate pad through a respective second opening in said insulating layer, whereby the electrical connection from said gate pad to said polysilicon gate electrode includes the resistance of said at least selected two of said polysilicon resistors and wherein the predetermined resistance of said integral gate resistor is determined by the number of openings in said insulating layer connecting said polysilicon resistors in parallel with one another and to said gate finger and said gate pad.

11. The device of claim 10 wherein said junction pattern defines an IGBT.

12. The device of claim 11 wherein said integral gate resistor has a resistance in the range of 5 to 50 ohms.

13. The device of claim 12 wherein each of said polysilicon resistors has a resistance of about 80 ohms.

14. The device of claim 10 wherein each of said polysilicon resistors has a resistance of about 80 ohms.

15. The device of claim 10 wherein said polysilicon resistors have identical structures and are disposed parallel to one another.

16. The device of claim 15 wherein each of said polysilicon resistors has a corresponding pair of openings, and wherein each of said polysilicon resistors has a thickness of about 5000 Å, a length between openings of about 40 microns and a width of about 70 microns.

17. The device of claim 16 wherein said junction pattern defines an IGBT.

18. The device of claim 17 wherein each of said polysilicon resistors has a resistance of about 80 ohms.

19. The device of claim 15 wherein said junction pattern defines an IGBT.

20. The device of claim 19 wherein each of said polysilicon resistors has a resistance of about 80 ohms.

21. The device of claim 10 wherein said junction pattern defines at least one power MOSFET element.

22. The device of claim 10 wherein said junction pattern defines a MOS gated thyristor.

23. A MOS gate controlled device having an integral gate resistor with a predetermined resistance; said device comprising a silicon die having a predetermined power device junction pattern therein; said junction pattern including a channel region and a polysilicon gate electrode for controlling said channel region to control the turn on and/or off of said device; one surface of said die having an elongated metallic gate finger structure which is connected to said polysilicon gate electrode and a metallic gate pad adapted to be contacted by an external gate lead; and a plurality of spaced elongated polysilicon resistors, at least one of said polysilicon resistors having one end connected to a portion of said gate finger and an opposite end connected to said gate pad, whereby the electrical connection from said gate pad to said polysilicon gate electrode includes the resistance of said at least one of said polysilicon resistors and the predetermined resistance of said integral gate resistor is determined by the number of said polysilicon resistors which are connected in parallel to said gate finger and said gate pad; said metallic gate pad having a lateral edge portion facing said gate finger; said lateral edge portion having a cutout segment and an uncut segment, said uncut segment overlying said opposite end of said at least one polysilicon resistor, and said cutout segment is removed from and is not connected to an opposite end of at least another one of said polysilicon resistors.

24. The device of claim 23 wherein said uncut segment overlies a respective opposite end of at least two of said plurality of said polysilicon resistors, and said cutout segment is removed from and is not connected to respective opposite ends of a remainder of said plurality of polysilicon resistors.

25. The device of claim 24 wherein the shape of said cutout segment determines the number of said polysilicon resistors which are connected in parallel, and thus the value of said integral gate resistor.

26. The device of claim 25 wherein said junction pattern defines an IGBT.

27. The device of claim 26 wherein each of said polysilicon resistors has a resistance of about 80 ohms.

28. The device of claim 23 wherein the shape of said cutout segment determines the number of said polysilicon resistors which are connected in parallel, and thus the value of said integral gate resistor.

29. The device of claim 28 wherein said junction pattern defines an IGBT.

30. The device of claim 29 wherein each of said polysilicon resistors has a resistance of about 80 ohms.

31. The device of claim 23 wherein said junction pattern defines an IGBT.

32. The device of claim 31 wherein said integral gate resistor has a resistance in the range of 5 to 50 ohms.

33. The device of claim 32 wherein each of said polysilicon resistors has a resistance of about 80 ohms.

34. The device of claim 23 wherein each of said polysilicon resistors has a resistance of about 80 ohms.

35. The device of claim 23 wherein said polysilicon resistors have identical structures and are disposed parallel to one another.

36. The device of claim 35 wherein each of said polysilicon resistors has a corresponding pair of openings, and wherein each of said polysilicon resistors has a thickness of about 5000 Å, a length between the corresponding pair of openings of about 40 microns and a width of about 70 microns.

37. The device of claim 36 wherein said junction pattern defines an IGBT.

38. The device of claim 37 wherein each of said polysilicon resistors has a resistance of about 80 ohms.

39. The device of claim 35 wherein said junction pattern defines an IGBT.

40. The device of claim 39 wherein each of said polysilicon resistors has a resistance of about 80 ohms.

41. The device of claim 23 wherein said junction pattern defines at least one power MOSFET element.

42. The device of claim 23 wherein said junction pattern defines a MOS gated thyristor.

43. A MOS gate controlled device having an integral gate resistor with a predetermined resistance; said device comprising a silicon die having a predetermined power device junction pattern therein; said junction pattern including a channel region and a polysilicon gate electrode for controlling said channel region to control the turn on and/or off of said device; one surface of said die having an elongated metallic gate finger structure which is connected to said polysilicon gate electrode and a metallic gate pad adapted to be contacted by an external gate lead; a plurality of thin sheets of resistive material defining a plurality of spaced parallel resistors, at least one of said parallel resistors having one end connected to a portion of said gate finger and an opposite end connected to said gate pad, whereby the electrical connection from said gate pad to said polysilicon gate electrode includes the resistance of said at least one of said parallel resistors and the predetermined resistance of said integral gate resistor is determined by the number of said parallel resistors which are connected in parallel to said gate finger and said gate pad; said metallic gate pad having a lateral edge portion facing said gate finger; said lateral edge portion having a cutout segment and an uncut segment, said uncut segment overlying said opposite end of said at least one resistor, and said cutout segment is removed from and is not connected to an opposite end of at least another one of said resistors.

44. The device of claim 43 wherein the resistance of said thin sheets of resistive material is adjusted by adjusting the cross-sectional area of each of said plurality of parallel spaced resistors.

45. The device of claim 44 wherein a predetermined number of said thin sheets of resistive material are connected to said gate pad and to said gate finger at a plurality of spaced locations.

46. The device of claim 45 wherein said predetermined number of said thin sheets of resistive material are of polysilicon.

47. The device of claim 43 wherein said integral gate resistor has a resistance in the range of 5 to 50 ohms.

48. The device of claim 43 wherein said thin sheets of resistive material are of polysilicon.

49. The device of claim 43 wherein said junction pattern defines an IGBT.

50. The device of claim 43 wherein said junction pattern defines at least one power MOSFET element.

51. The device of claim 43 wherein a predetermined number of said thin sheets of resistive material are connected to said gate pad and to said gate finger at a plurality of spaced locations.

\* \* \* \* \*